United States Patent [19]

Rouse et al.

[11] Patent Number: 5,034,343
[45] Date of Patent: Jul. 23, 1991

[54] MANUFACTURING ULTRA-THIN WAFER USING A HANDLE WAFER

[75] Inventors: George V. Rouse; Paul S. Reinecke, both of Indialantic; Craig J. McLachlan, Melbourne Beach, all of Fla.

[73] Assignee: Harris Corporation, Melborne, Fla.

[21] Appl. No.: 490,316

[22] Filed: Mar. 8, 1990

[51] Int. Cl.$^5$ ...................... H01L 21/20; H01L 21/76
[52] U.S. Cl. ............................ 437/86; 148/DIG. 135; 437/62; 437/228; 437/974
[58] Field of Search .................... 437/62, 86, 974, 228; 148/DIG. 135

[56] References Cited

U.S. PATENT DOCUMENTS

| | | |
|---|---|---|
| 3,508,980 | 3/1970 | Jackson et al. ................ 437/86 |
| 3,689,357 | 9/1972 | Jordan ........................... 428/163 |
| 4,017,341 | 4/1977 | Suzuki et al. .................. 437/62 |
| 4,292,730 | 10/1981 | Ports ............................. 437/60 |
| 4,321,747 | 3/1982 | Takenura et al. . |
| 4,357,180 | 11/1982 | Molnar .......................... 437/22 |
| 4,638,552 | 1/1987 | Shimjo et al. ................. 437/31 |
| 4,878,957 | 11/1989 | Yamaguchi et al. ........... 437/62 |
| 4,888,304 | 12/1989 | Nakagawa et al. ....... 148/DIG. 135 |
| 4,908,328 | 3/1990 | Hu et al. . |
| 4,948,748 | 8/1990 | Kitihara et al. .......... 148/DIG. 135 |

FOREIGN PATENT DOCUMENTS

| | | | |
|---|---|---|---|
| 51103672 | 3/1978 | Japan .................. | 437/974 |
| 0058817 | 3/1988 | Japan .................. | 437/974 |
| 63-246841 | 10/1988 | Japan . | |

Primary Examiner—Olik Chaudhuri
Assistant Examiner—Kenneth Horton
Attorney, Agent, or Firm—Barnes & Thornburg

[57] ABSTRACT

A process including bonding a first device wafer to a handle wafer by an intermediate bonding oxide layer and thinning the device wafer to not greater than 7 mils. An epitaxial device layer of under 1 mil may be added. Device formation steps are performed on a first surface of the first device wafer. This is followed by removing the handle wafer to produce a resulting wafer having substantially the thickness of the first device layer. To produce a silicon on insulator (SOI), a third device wafer is bonded to the first surface of the first device wafer by the intermediate oxide layer and the third wafer is thinned to not greater than 40 microns. The first and third device wafers form the resulting SOI wafer.

16 Claims, 2 Drawing Sheets

MANUFACTURING ULTRA-THIN WAFER USING A HANDLE WAFER

BACKGROUND AND SUMMARY OF THE PRESENT INVENTION

The invention relates generally to integrated circuits with thin device areas and more specifically to an improved method of making ultra-thin wafers.

The formation of thin device areas is generally produced in the prior art by epitaxially depositing the device area on a substrate, applying a handling wafer to the epitaxially layer and then removing the original substrate. The ultimate wafer includes the thickness of the handle as well as the epitaxial layer. The epitaxial layer is generally in the range of 5 to 25 microns and the handle is in the range of 19 to 24 mils. The processing to remove the original substrate affects the quality of the surface of the epitaxial layer in which the devices are to be formed. Also the planarity of the surface may be affected. In some applications, as shown in U.S. Pat. No. 4,292,730, the epitaxial layer may have other layers and handles applied thereto and the original handle removed. In this specific patent, both surfaces of the epitaxial layer have been treated in the process and thereby increase possible quality control of the device surfaces as well as planarity.

Thus, it is an object of the present invention to provide a method of fabricating ultra-thin wafers without modification of the surface of the device layer in which devices are to be formed.

Another object of the present invention is to provide a method of fabricating ultra-thin wafers in a thickness not greater than 7 mils.

These and other objects are obtained by bonding a first device wafer to a handle wafer by an intermediate oxide layer and thinning the first device wafer to not greater than 7 mils in thickness above the oxide layer. Device formation steps are performed in an epitaxial layer deposited on the first device wafer. This is followed by removing the handle wafer with an etch which stops on the intermediate oxide layer to produce a resulting wafer having substantially the thickness of the first wafer. In addition to the device forming steps, device isolation steps are also performed between the bonding and the removing of the handle steps. To produce a silicon on insulator (SOI), the handle wafer and first device wafer (not greater than 7 mils thick) is oxidized to form an intermediate oxide layer and a third device wafer is then bonded to the surface of the first device wafer. This intermediate oxide layer forms part of the isolation layer of the resulting wafer after removal of the handle wafer. The device formation steps are then formed in the surface of the third device wafer. Lateral isolation can then be formed by introducing impurities for lateral junction isolation or the third device wafer can be etched to form lateral dielectric isolation by air or by filling with dielectric material. Alternatively, oxygen implantation may be performed on the first device wafer to produce the horizontal dielectric oxide layer. Any of the isolation techniques may also be performed on the first device wafer without the use of a third device wafer. The handle wafer is removed by grinding a substantial portion of the thickness of the handle wafer and etching the remaining portion of the handle wafer using the first bonding oxide layer as an etching stop.

Other objects, advantages and novel features of the present invention will become apparent from the following detailed description of the invention when considered in conjunction with the accompanying drawings.

DETAILED DESCRIPTION OF THE DRAWINGS

Figure 1A:
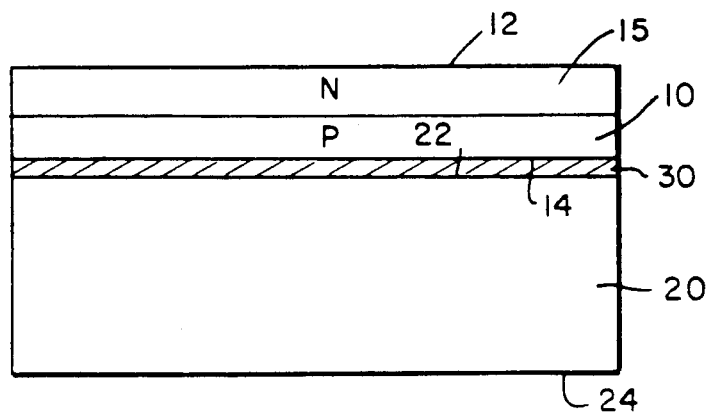
FIGS. 1A and 1B show a process for fabricating an ultra-thin wafer using wafer bonding techniques according to the principles of the present invention.

The process begins by bonding a device wafer, 10, to a handle wafer 20 using a bonding oxide layer 30 as shown in FIG. 1A. The device wafer, 10, is then thinned to less than 7 mils and is generally in the range of 2 to 6 mils. The handle 20 has a thickness in the range of 19 to 25 mils and the oxide layer 30 in the range of 1 to 3 microns. The oxide layer 30 may be formed on either the bonding surfaces 14 of the device wafer 10 or surface 22 of the handle wafer 20. The two wafers and the oxide layer are brought together and heated to produce the oxide bonding. An epitaxial silicon layer 15 of opposite conductivity type N is grown on the surface of P device wafer 10 for device formation and is generally less than 20 microns thick. Device formation and isolation steps are performed on the exposed surface 12 of the epitaxial layer 15 of the device wafer 10. These may include metallization as well as isolation formation steps.

Figure 1B:
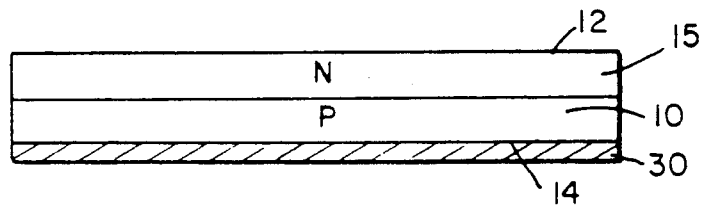

Once the device processing is concluded, the handling wafer 20 in FIG. 1A is removed. This includes grinding beginning at surface 24 until a substantial portion of the handle wafer 20 has been removed. The remaining portion is then removed by etching down to the bonding oxide layer 30 which acts as an etching stop. The oxide layer 30 may remain and be used in the ultimate wafer or may be also removed. As can be seen from FIG. 1B, the thickness of the wafer is substantially the thickness of the original wafer 10 and epitaxial layer 15 in the range of 2 to 6 microns except for a thin oxide layer 30 which is in the range of 1 to 3 microns. Neither of the surfaces 12 or 14 have been modified during the processing steps other than the application of the bonding oxide layer 30. Thus, defects within the wafer 10 have been minimized and its planarity assured.

Figure 2:
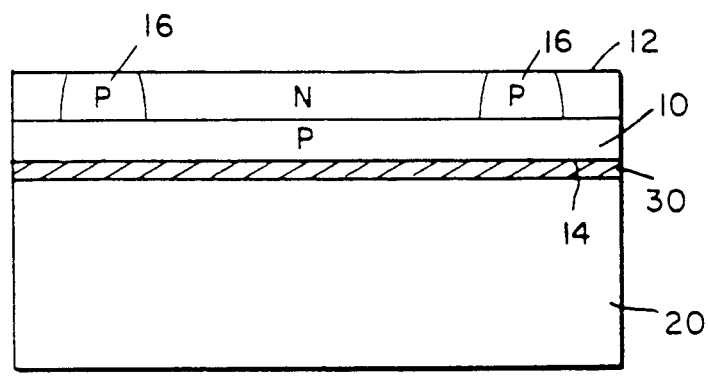
FIG. 2 shows the process step of forming junction lateral isolation.

If junction isolation is to be used, impurities may be introduced to form lateral junction isolations as in well known junction isolation technologies. As illustrated in FIG. 2, if the epitaxial layer 15 is an N conductivity type, P type impurities are introduced to form lateral isolation regions 16 down to the original substrate or wafer 10.

Figure 3:
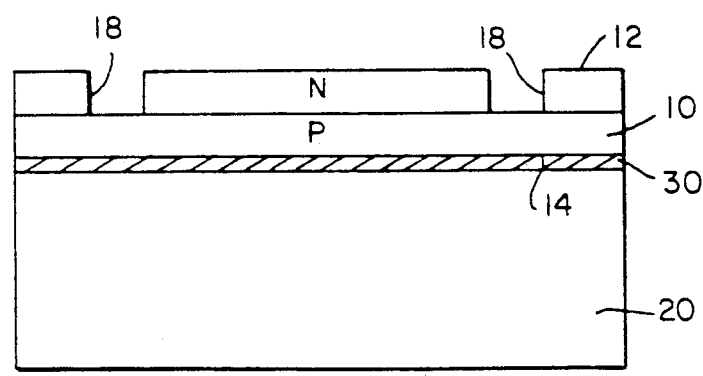
FIG. 3 shows the process step for forming lateral dielectric isolation.

To produce lateral dielectric isolation, moats 18 may be formed in the top surface 12 of the epitaxial layer 15 on the wafer 10 as illustrated in FIG. 3. These moats 18 produce mesa and use air as the dielectric isolation or may be filled with a dielectric isolation as an oxide or a thin oxide layer and then further filled with polycrystalline material and planarized to surface 12.

Figure 4:
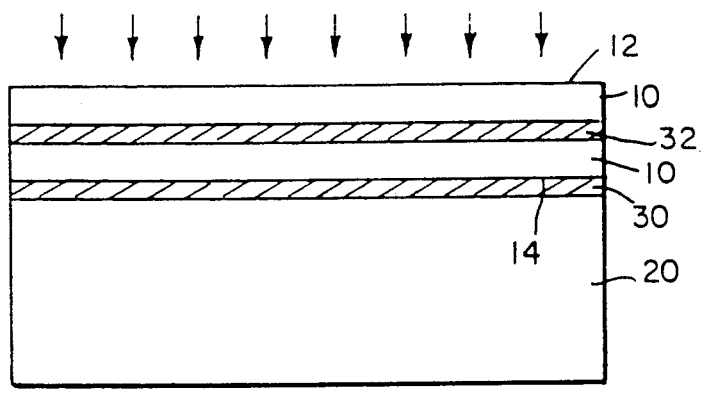
FIG. 4 shows the process step for forming SOI using oxygen implantation.

To form SOI devices, oxygen may be implanted through the surface 12 to form oxide layer 32 between the surfaces 12 and 14 of the device wafer 10 as illustrated in FIG. 4. The device thickness would then be the portion of the original wafer 10 between the top layer 12 and the oxide region 32. Thus, the thin device layers are thinner than the ultra-thin wafer 10.

Figure 5A:
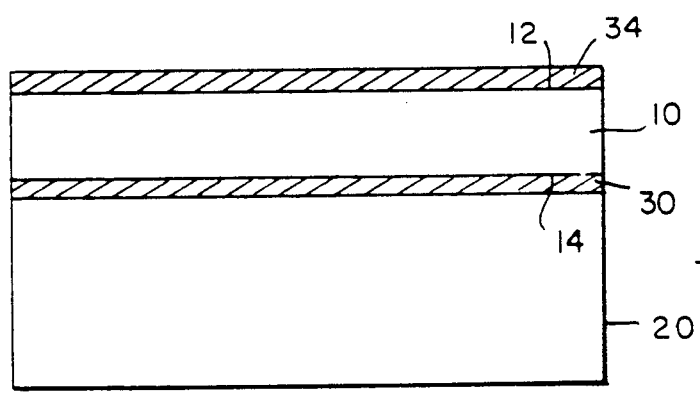
FIGS. 5A through 5C show the process steps for forming SOI using a double bonding technique according to the principles of the present invention.
Figure 5B:
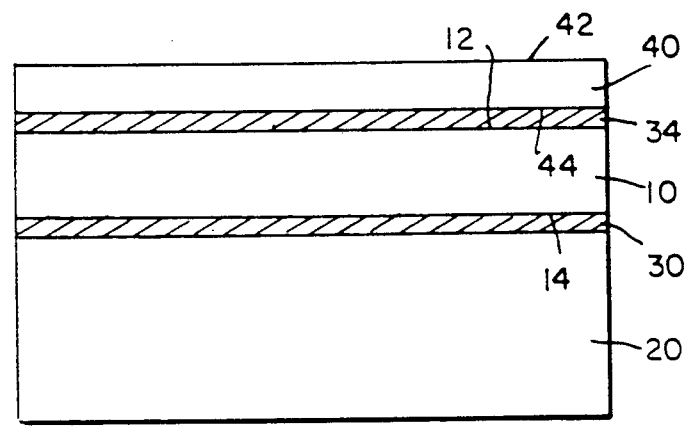
Figure 5C:
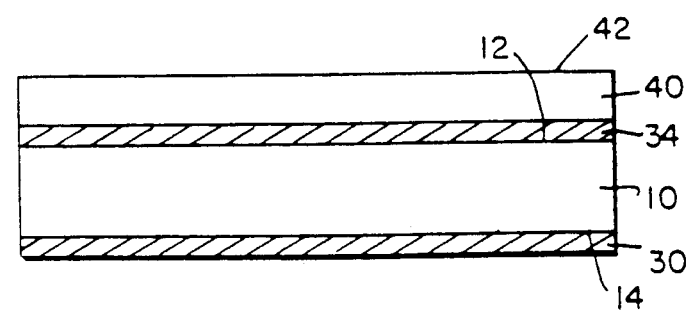

An alternative method of forming an SOI wafer is illustrated in FIGS. 5A through 5C using a double bonding technique. A second oxide layer 34 is formed on the top surface 12 of FIG. 1A as illustrated in FIG. 5A. A device wafer 40, which is a third wafer, is bonded to the first wafer 10 and the handle 20 by the oxide layer 34 at its bonding surface 44. Device wafer 40 is then thinned either chemically or mechanically. The device formation and isolation steps are performed on the surface 42 of the device layer 40. Upon completion of these steps, the handle 20 is removed by a combination of grinding and etching to produce the structure of FIG. 5C. The device layer 40 is under 40 microns and is generally in the 1 to 40 micron range. With the insulative bonding layer 34 having a thickness in the range of 1 to 3 microns, the overall thickness of the resulting wafer FIG. 5C between the surfaces 42 of the device wafer 40 and surface 14 of the first wafer 10 is in the range 2 to 6 mils after thinning device layer 40.

Any of the isolation techniques of FIGS. 2 through 4 may be used in the device layer 40 of FIG. 5.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A method of fabricating integrated circuits in ultra thin wafers comprising:
   bonding a first device wafer to a handle wafer by an intermediate oxide layer and thinning said first device wafer to a desired wafer thickness of not greater than 7 mils;
   performing device formation steps on a first surface of said thinned first device wafer; and
   removing said handle wafer to produce a wafer having substantially the thickness of said first device wafer.

2. A method according to claim 1 including performing device isolation step after said bonding step and before said removing step.

3. A method according to claim 2, wherein:
   said device isolation steps includes bonding a third device wafer to said first surface of said first device wafer by an intermediate oxide layer which forms part of said device isolation and thinning said third device wafer to no more than 40 microns and;
   said device formation steps are performed on the surface of said third device wafer.

4. A method according to claim 3, wherein said device isolation step includes introducing impurities into said third device wafer to form lateral junction isolation.

5. A method according to claim 3, wherein said device isolation step includes etching said third device wafer to form lateral dielectric isolation.

6. A method according to claim 2, wherein said device isolation step includes introducing impurities into said first device wafer to form junction isolation.

7. A method according to claim 2, wherein said device isolation step includes etching said first device wafer to form lateral dielectric isolation.

8. A method according to claim 2, wherein said device isolation steps include implanting oxygen to form a dielectric layer within said first device wafer.

9. A method according to claim 1, wherein removing said handle wafer includes grinding said handle wafer for a substantial portion of its thickness and etching the remaining portion of said handle wafer using said oxide layer as an etching stop.

10. A method according to claim 1 including forming an expitaxial layer on said first device layer after thinning under 1 mil, and performing said device formation steps on said epitaxial layer.

11. A method according to claim 10
    wherein said epitaxial layer is formed of a second conductivity type opposite a first conductivity type of said first device wafer to form horizontal junction isolation; and
    including etching said epitaxial layer down to said first device layer to form lateral dielectric isolation.

12. A method according to claim 10
    wherein said epitaxial layer is formed of a second conductivity type opposite a first conductivity type of said first device wafer to form horizontal junction isolation; and
    including introducing impurities of said first conductivity type into said epitaxial layer to form lateral junction isolation extending down to said first device wafer.

13. A method of fabricating integrated circuits in ultra-thin wafers comprising:
    bonding a first device wafer to a handle wafer by a first intermediate oxide layer and thinning said first device wafer to not greater than 7 mils;
    bonding a third device wafer to said first device wafer by a second intermediate oxide layer and thinning the third wafer to less than 40 microns;
    performing device formation steps on a first surface of said third device wafer; and
    removing said handle wafer to produce a wafer having the thickness substantially of the combined first and third device wafers with device thickness defined by said third layer.

14. A method according to claim 13 including introducing impurities into said third device wafer to form lateral junction isolation before removing said handle wafer.

15. A method according to claim 13 including etching said third device wafer to form lateral dielectric isolation before removing said handle wafer.

16. A method according to claim 13, wherein removing said handle wafer includes grinding said handle wafer for a substantial portion of its thickness and etching the remaining portion of said handle wafer using said oxide layer as an etching stop.

* * * * *